(12) United States Patent
Mouli

(10) Patent No.: US 7,279,395 B2
(45) Date of Patent: Oct. 9, 2007

(54) SUPPRESSION OF DARK CURRENT IN A PHOTOSENSOR FOR IMAGING

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 187 days.

(21) Appl. No.: 11/052,203

(22) Filed: Feb. 8, 2005

(65) Prior Publication Data

US 2005/0145902 A1 Jul. 7, 2005

Related U.S. Application Data

(62) Division of application No. 10/653,152, filed on Sep. 3, 2003, now Pat. No. 7,064,406.

(51) Int. Cl.
*H01L 21/76* (2006.01)

(52) U.S. Cl. ............... 438/424; 438/595; 257/446; 257/93; 257/374

(58) Field of Classification Search .......... 257/446, 257/93, 374; 438/424, 595
See application file for complete search history.

(56) References Cited

U.S. PATENT DOCUMENTS

| | | | |
|---|---|---|---|
| 5,485,019 A | | 1/1996 | Yamazaki et al. |
| 5,618,379 A * | | 4/1997 | Armacost et al. ........... 438/595 |
| 5,985,689 A | | 11/1999 | Gofuku et al. |
| 6,271,554 B1 | | 8/2001 | Nozaki et al. |
| 6,362,040 B1 * | | 3/2002 | Tews et al. ............... 438/246 |
| 6,566,722 B1 | | 5/2003 | Lin et al. |
| 6,780,666 B1 * | | 8/2004 | McClure .................. 438/57 |
| 2003/0143812 A1 * | | 7/2003 | Lin .......................... 438/296 |
| 2004/0250392 A1 * | | 12/2004 | Chou et al. .............. 29/25.01 |
| 2005/0001248 A1 | | 1/2005 | Rhodes |
| 2005/0112833 A1 * | | 5/2005 | Hareland et al. ........... 438/302 |
| 2005/0145902 A1 * | | 7/2005 | Mouli ....................... 257/291 |
| 2006/0008938 A1 | | 1/2006 | Mouli et al. |
| 2006/0138470 A1 * | | 6/2006 | Han ......................... 257/233 |
| 2006/0246714 A1 * | | 11/2006 | Derraa ..................... 438/627 |

OTHER PUBLICATIONS

Chapter 1, "Ionizing radiation effects on MOS devices and Ics", pp. 35-62, unknown date.
B.C. Burkey et al., "The Pinned Photodiode for an Interline-Transfer CCD Image Sensor", CH2099-0/84/0000-0028, 1984.
Masahiro Ushiyama et al., "Suppression of Anomalous Leakage Current in Tunnel Oxides by Fluorine Implantation to Realize Highly Reliable Flash Memory," 1999 Symposium on VLSI Technology Digest of Technical Papers.
Kiyonori Ohyu et al., "Improvement of $SiO_2$/Si Interface Properties Utilising Fluorine Ion Implantation and Drive-in Diffusion," Japanese Journal of Applied Physics, vol. 28, No. 6, Jun. 1989, pp. 1041-1045.
Singapore Patent Office Communication issued Feb. 19, 2007.

* cited by examiner

*Primary Examiner*—Thao P. Le
(74) *Attorney, Agent, or Firm*—Dickstein Shapiro LLP

(57) ABSTRACT

A pixel cell having a halogen-rich region localized between an oxide isolation region and a photosensor. The halogen-rich region prevents leakage from the isolation region into the photosensor, thereby suppressing dark current in imagers.

12 Claims, 12 Drawing Sheets

SUPPRESSION OF DARK CURRENT IN A PHOTOSENSOR FOR IMAGING

CROSS-REFERENCE TO RELATED APPLICATION

This application is a divisional of application Ser. No. 10/653,152, filed on Sep. 3, 2003, now U.S. Pat. No. 7,064,406.

FIELD OF THE INVENTION

The present invention relates generally to an imaging device and more specifically to an imaging device pixel cell having a halogen-rich region formed therein, suppressing dark current in a photosensor.

BACKGROUND OF THE INVENTION

Imaging devices, including charge-coupled-devices (CCD) and complementary metal oxide semiconductor (CMOS) sensors have commonly been used in photo-imaging applications.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes. The disclosures of each of the forgoing patents are hereby incorporated by reference in their entirety.

An imager, for example, a CMOS imager includes a focal plane array of pixel cells; each cell includes a photosensor, for example, a photogate, a photoconductor, or a photodiode overlying a substrate for producing a photo-generated charge in a doped region of the substrate. A readout circuit is provided for each pixel cell and includes at least a source follower transistor and a row select transistor for coupling the source follower transistor to a column output line. The pixel cell also typically has a floating diffusion node, connected to the gate of the source follower transistor. Charge generated by the photosensor is sent to the floating diffusion node. The imager may also include a transfer transistor for transferring charge from the photosensor to the floating diffusion node and a reset transistor for resetting the floating diffusion node to a predetermined charge level prior to charge transference.

A conventional pixel cell 10 of an image sensor, such as a CMOS imager, is illustrated in FIG. 1. Pixel cell 10 typically includes a photosensor 12 having a p-region 12*a* and n-region 12*b* in a p-substrate 14. The p-region 12*a* of the photosensor 12 is typically coupled to the potential of the p-substrate 14 for efficient operation of the photosensor 12. The pixel cell 10 also includes a transfer transistor with associated gate 16, a floating diffusion region 18 formed in a more heavily doped p-type well 20, and a reset transistor with associated gate 22. The reset transistor 22 has an associated source/drain region 30 that is used when resetting the floating diffusion region 18 to a predetermined charge level prior to charge transference.

Photons striking the surface of the p-region 12*a* of the photosensor 12 generate electrons that are collected in the n-region 12*b* of the photosensor 12. When the transfer gate 16 is on, the photon-generated electrons in the n-region 12*b* are transferred to the floating diffusion region 18 as a result of the potential difference existing between the photosensor 12 and floating diffusion region 18. Floating diffusion region 18 is coupled to the gates of a source follower transistor 24, which receives the charge temporarily stored by the floating diffusion region 18 and transfers the charge to a first source/drain terminal of a row select transistor 26. When the row select signal RS goes high, the photon-generated charge is transferred to the column line 28 where it is further processed by sample/hold and processing circuits (not shown).

Pixel cell 10 is typically formed between two isolation regions 32. In the illustrated pixel cell 10 the two isolation regions are shallow trench isolation (STI) regions 32. The STI regions 32 prevent crosstalk between adjacent pixels, as pixel cell 10 is only one of hundreds or thousands of pixels in a pixel cell array. The pixel cell array is typically organized as rows and columns. Each row and column is read out in sequence to produce an overall digitized image, described in greater detail below.

In general, the fabrication of an STI region 32 includes etching a trench into substrate 14 and filling the trench with a dielectric to provide a physical and electrical barrier between adjacent pixels. Refilled trench structures, for example, STI region 32, are formed by etching a trench by a dry anisotropic or other etching process and then filling it with a dielectric such as a chemical vapor deposited (CVD) or high density plasma (HDP) deposited silicon oxide or silicon dioxide ($SiO_2$). The filled trench is then planarized by a chemical mechanical planarization (CMP) or etch-back process so that the dielectric remains only in the trench and its top surface remains level with that of the silicon substrate.

Forming pixel cell 10 between STI regions 32, however, creates problems in the operation of the pixel cell 10. For example, STI sidewalls and bottom portion, herein collectively referred to as STI boundaries 32*a*, have a higher silicon density than the substrate 14, creating a higher density of "trap sites" along the STI boundaries 32*a* as compared to the silicon/gate oxide interface of a transistor (e.g., transfer transistor 16). Trap sites are areas in the silicon dioxide/silicon interface that can "trap" electrons or holes. Trap sites result from defects along the silicon dioxide/silicon interface between the STI boundaries 32*a* and the silicon substrate 14. For example, dangling bonds or broken bonds along the silicon dioxide/silicon interface can trap electrons or holes.

The trap sites are typically uncharged, but become energetic when electrons and holes become trapped therein. Highly energetic electrons or holes are called hot carriers. Hot carriers can get trapped in the available trap sites, and contribute to the fixed charge of the device and change the threshold voltage and other electrical characteristics of the device. STI boundaries 32*a* may also contain a higher level of defect density due to different crystallographic orientation planes along the STI boundaries 32*a*. The high defect densities along with higher trap sites lead to higher leakage levels along the STI boundaries 32*a*. The current generation from trap sites inside or near the photosensor 12 contributes to dark current (i.e., electrical current in the photosensor in the absence of light) in CMOS imagers since a constant charge is leaking into the photosensor 12. Dark current is detrimental to the operation and performance of a photosensor. Accordingly, it is desirable to provide an isolation technique that prevents current generation or current leakage.

BRIEF SUMMARY OF THE INVENTION

The present invention provides an isolation technique for preventing current generation and leakage in a pixel cell of an imager device.

The above and other features and advantages are achieved in various embodiments of the invention by providing a pixel cell having a halogen-rich region localized between an isolation region and a photosensor. The halogen-rich region prevents leakage from the isolation region into the photosensor, thereby suppressing the dark current in the imager.

BRIEF DESCRIPTION OF THE DRAWINGS

The above-described features and advantages of the invention will be more clearly understood from the following detailed description, which is provided with reference to the accompanying drawings in which.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "semiconductor substrate," "silicon substrate," and "substrate" are to be understood to include any semiconductor-based structure. The semiconductor structure should be understood to include silicon, silicon-on-insulator (SOI), silicon-on-sapphire (SOS), silicon-germanium, doped and undoped semiconductors, epitaxial layers of silicon supported by a base semiconductor foundation, and other semiconductor structures. When reference is made to the substrate in the following description, previous process steps may have been utilized to form regions or junctions in or over the base semiconductor or foundation.

The term "pixel," as used herein, refers to a photo-element unit cell containing a photosensor for converting photons to an electrical signal. For purposes of illustration, a single representative pixel and its manner of formation are illustrated in the figures and description herein; however, typically fabrication of a plurality of like pixels proceeds simultaneously. Accordingly, the following detailed description is not to be taken in a limiting sense, and the scope of the present invention is defined only by the appended claims.

The term "halogen-rich region," as used herein, refers to an ion-rich region in a substrate. The ions formed in the substrate may include any of the halogen ions including, but not limited to, fluorine, chlorine, bromine, iodine, or any combination thereof.

In the following description, the invention is described in relation to a CMOS imager for convenience; however, the invention has wider applicability to any photosensor of any imager cell. For example, although illustrated as a pinned photodiode, photosensor 12 (FIG. 2) could be a p-n junction photodiode, a Schottky photodiode, a photogate, or any other suitable photoconversion device. Additionally, although described in relation to a CMOS imager, the invention is applicable to a charge-coupled-device (CCD).

Figure 1:
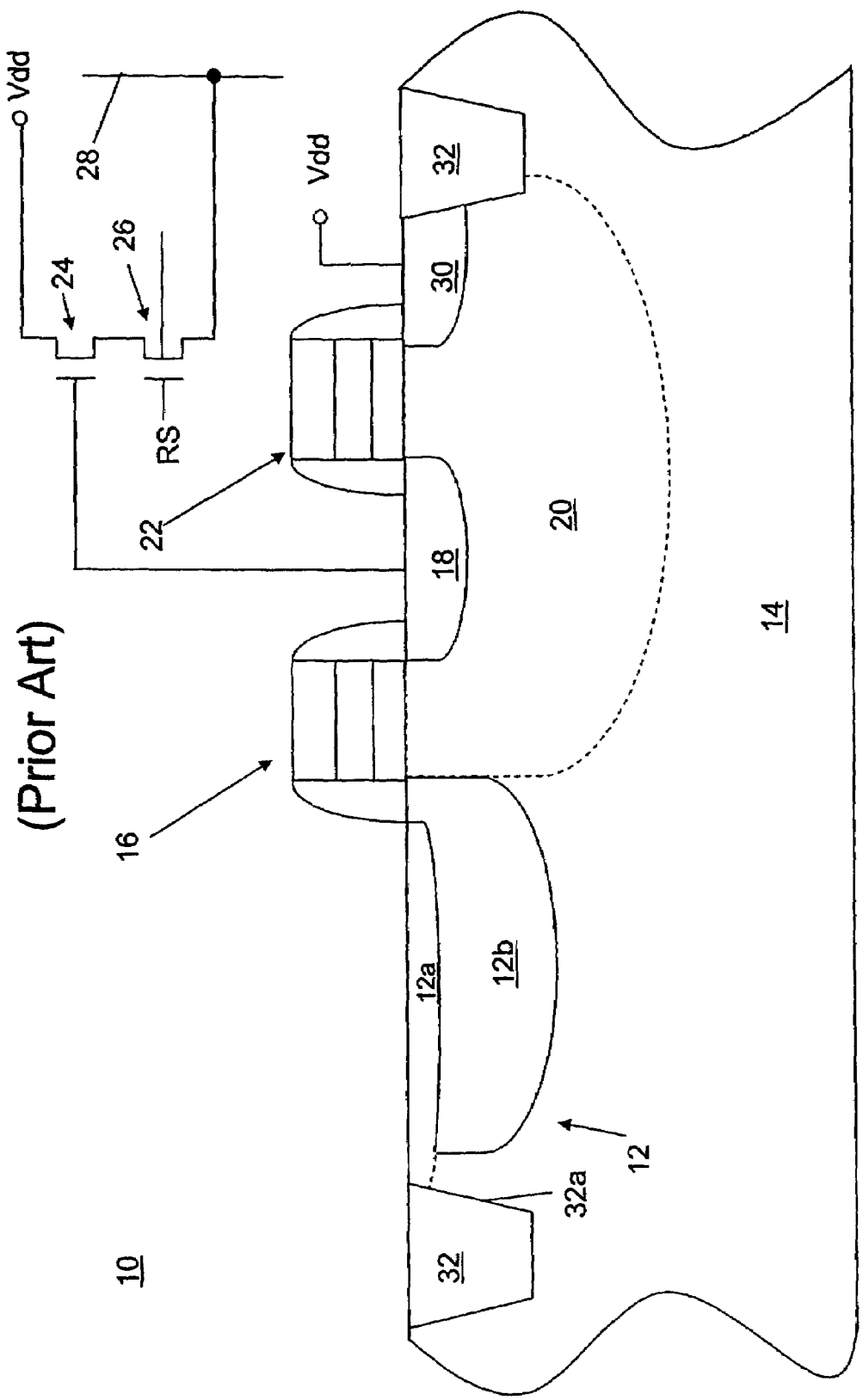
FIG. 1 illustrates a partial cross-sectional representation of a conventional pixel cell.
Figure 2:
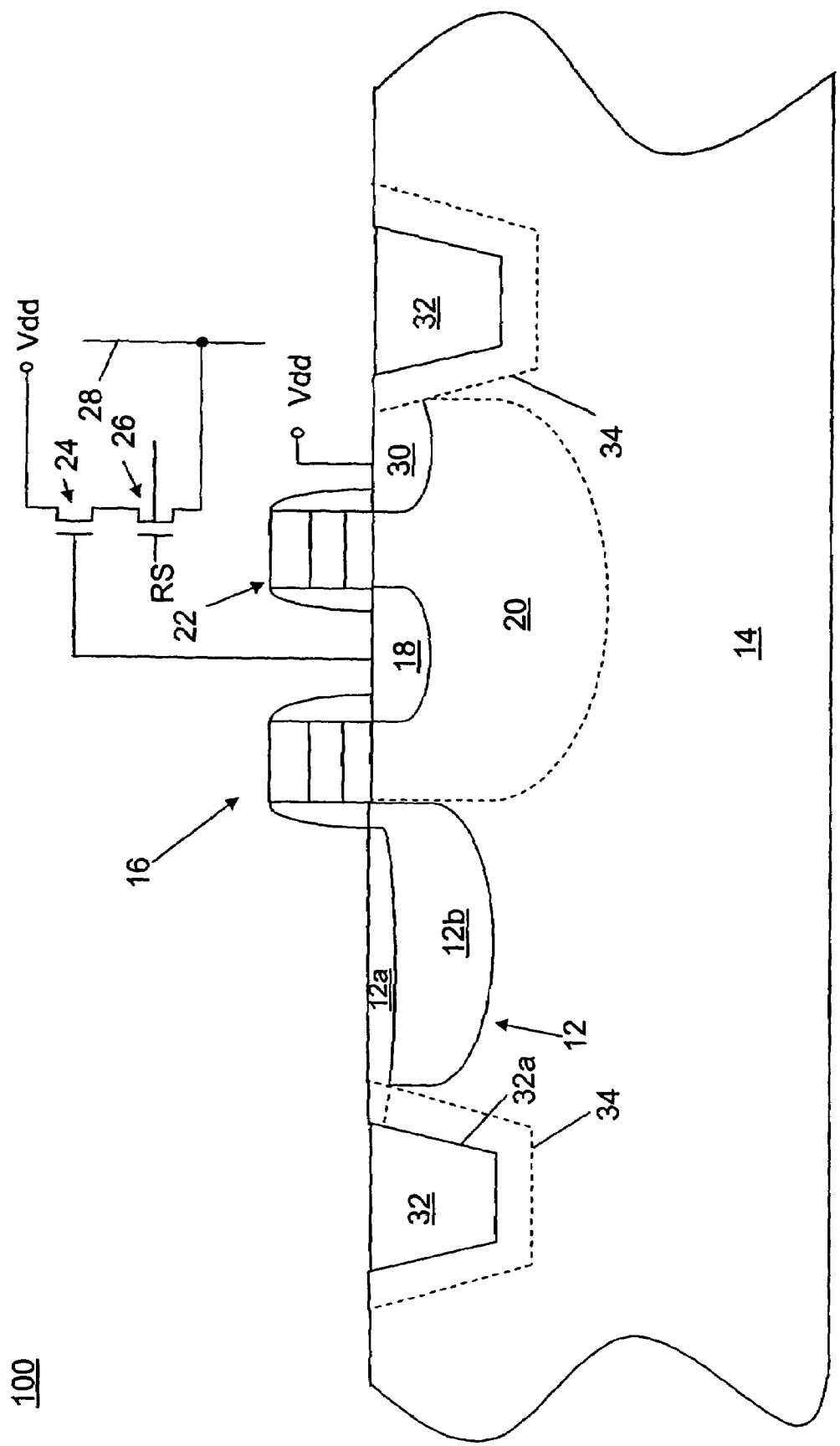
FIG. 2 illustrates a partial cross-sectional representation of a pixel cell constructed in accordance with an exemplary embodiment of the invention.

Referring now to the figures, where like reference numbers designate like elements, FIG. 2 illustrates an exemplary pixel cell 100 constructed in accordance with an embodiment of the invention. Pixel cell 100 is similar to the FIG. 1 pixel cell with the significant improvement of having a halogen-rich region 34 localized around the STI boundaries 32a that contact the silicon substrate 14. As noted above, the halogen-rich region 34 could include any halogen ion, including, but not limited to, fluorine, chlorine, bromine, iodine, or any combination thereof.

According to the invention, the halogen-rich region 34 has a concentration of halogen ions in a range of about $1\times10^{13}/cm^3$ to about $1\times10^{16}/cm^3$ with a peak ion concentration in the range of about 300-800 Å. In the illustrated embodiment, the halogen-rich region 34 has a halogen ion concentration of about $1\times10^{14}/cm^3$ and a substantially homogenous ion concentration to a depth of about 500 Å.

Although the halogen-rich region 34 may not decrease the number of defects found in the silicon dioxide/silicon interface between STI boundaries 32a and the substrate 14, the halogen-rich region 34 will prevent the effects of current generation or current leakage found in conventional pixel cells (described above with respect to FIG. 1). The halogen-rich region 34 acts to compensate the charge associated with dangling bonds or broken bonds near the silicon dioxide/silicon interface. By compensating for the charge associated with the dangling bonds, the resulting pixel cell 100 has decreased current generation and/or current leakage and, therefore, suppressed dark current.

Figure 3:
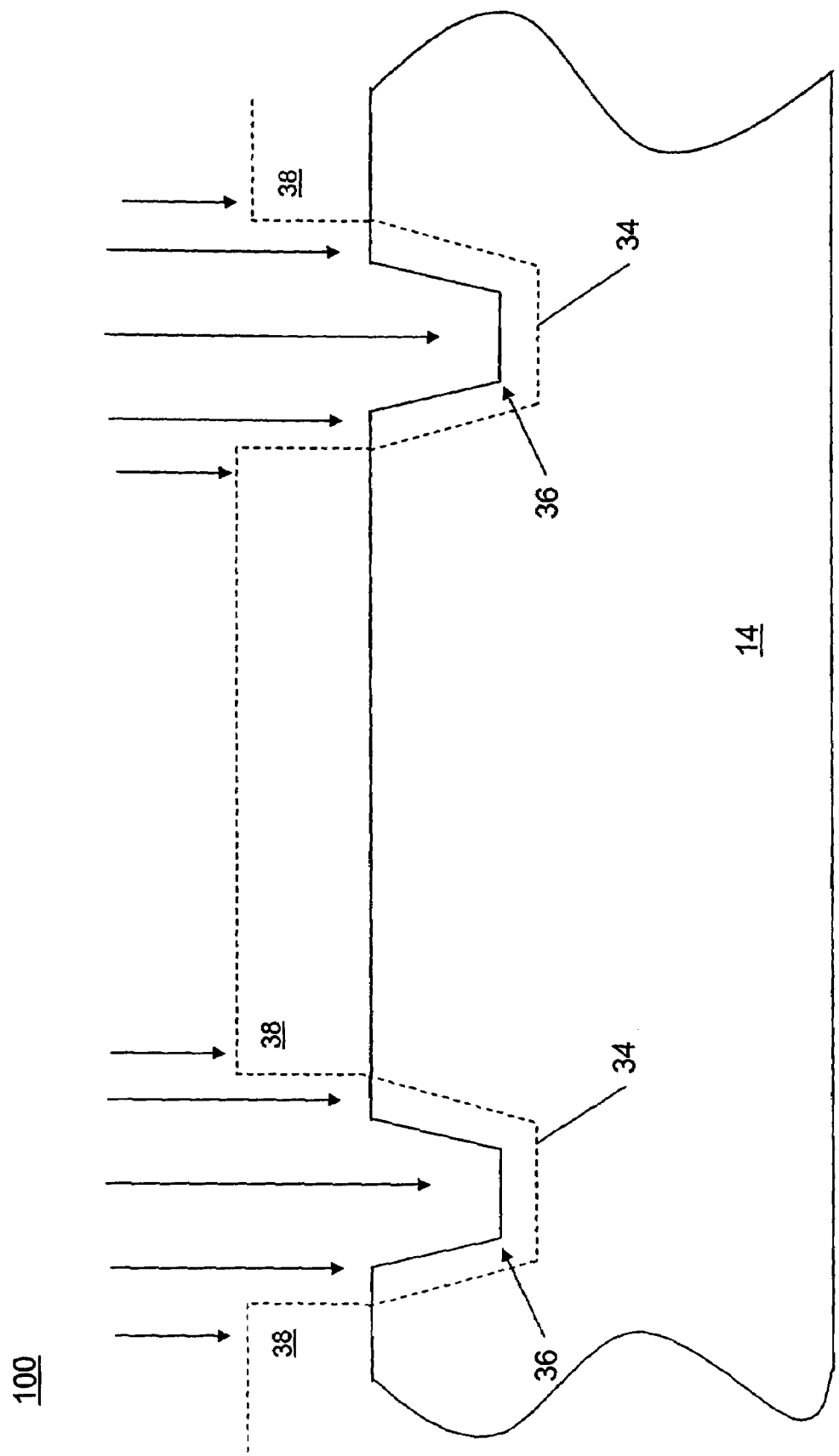
FIGS. 3-6 illustrate stages in fabrication of the pixel cell illustrated in FIG. 2.

FIGS. 3-6 illustrate stages of an exemplary method of forming the FIG. 2 pixel cell 100 by ion implantation. FIG. 3 illustrates a substrate 14 having trenches 36 formed by conventional etching methods. For example, the trenches 36 can be etched by chemical etching, anisotropic etching, reactive ion etching (RIE), or other means of creating a trench in the substrate 14. Masks 38 are positioned on the substrate 14 such that the trenches 36 and desired surfaces of the substrate 14 adjacent to the trenches 36 are exposed. The masks 38 serve to protect the surfaces of the substrate 14 that the masks 38 cover from halogen ion implantation, illustrated as arrows in FIG. 3. The halogen ion implantation results in localized halogen-rich regions 34 in the substrate 14.

According to an exemplary embodiment of the invention, the halogen-rich region 34 may be doped with an implant energy in the range of about 10 keV to about 50 keV to achieve a depth from a surface of the substrate 14 in the range of about 300 Å to about 800 Å. The illustrated pixel cell 100 is implanted with an implant energy of about 25 keV to achieve a peak halogen ion concentration at a depth of about 500 Å. As discussed below with respect to Table 1, the selected ion energy results in a peak concentration of halogen ions at a particular depth from the surface of the substrate 14. Table 1 illustrates the different ion energy ranges (Ion Energy) for implantation conditions using fluorine as the halogen species; the depth of peak concentration at a given ion energy (Range); the vertical standard deviation from the peak concentration depth (Longitudinal Straggling); and the horizontal standard deviation from the area of peak concentration (Lateral Straggling).

| Ion Energy (keV) | Range (Angstroms) | Longitudinal Straggling (Angstroms) | Lateral Straggling (Angstroms) |
| --- | --- | --- | --- |
| 10.00 | 233 | 123 | 88 |
| 11.00 | 253 | 132 | 95 |
| 12.00 | 274 | 141 | 102 |
| 13.00 | 295 | 150 | 108 |
| 14.00 | 315 | 159 | 114 |
| 15.00 | 336 | 168 | 121 |
| 16.00 | 357 | 177 | 127 |
| 17.00 | 377 | 185 | 133 |
| 18.00 | 398 | 194 | 139 |
| 20.00 | 440 | 211 | 151 |
| 22.00 | 482 | 227 | 163 |
| 24.00 | 524 | 243 | 175 |
| 26.00 | 566 | 259 | 187 |
| 28.00 | 608 | 275 | 199 |
| 30.00 | 651 | 290 | 210 |
| 33.00 | 715 | 313 | 228 |
| 36.00 | 779 | 335 | 245 |
| 40.00 | 866 | 364 | 268 |
| 45.00 | 974 | 399 | 296 |
| 50.00 | 1083 | 433 | 324 |
| 55.00 | 1192 | 466 | 351 |
| 60.00 | 1302 | 498 | 378 |
| 65.00 | 1411 | 529 | 405 |
| 70.00 | 1521 | 559 | 431 |
| 80.00 | 1741 | 616 | 483 |
| 90.00 | 1961 | 671 | 534 |
| 100.00 | 2180 | 723 | 583 |

Figure 4:
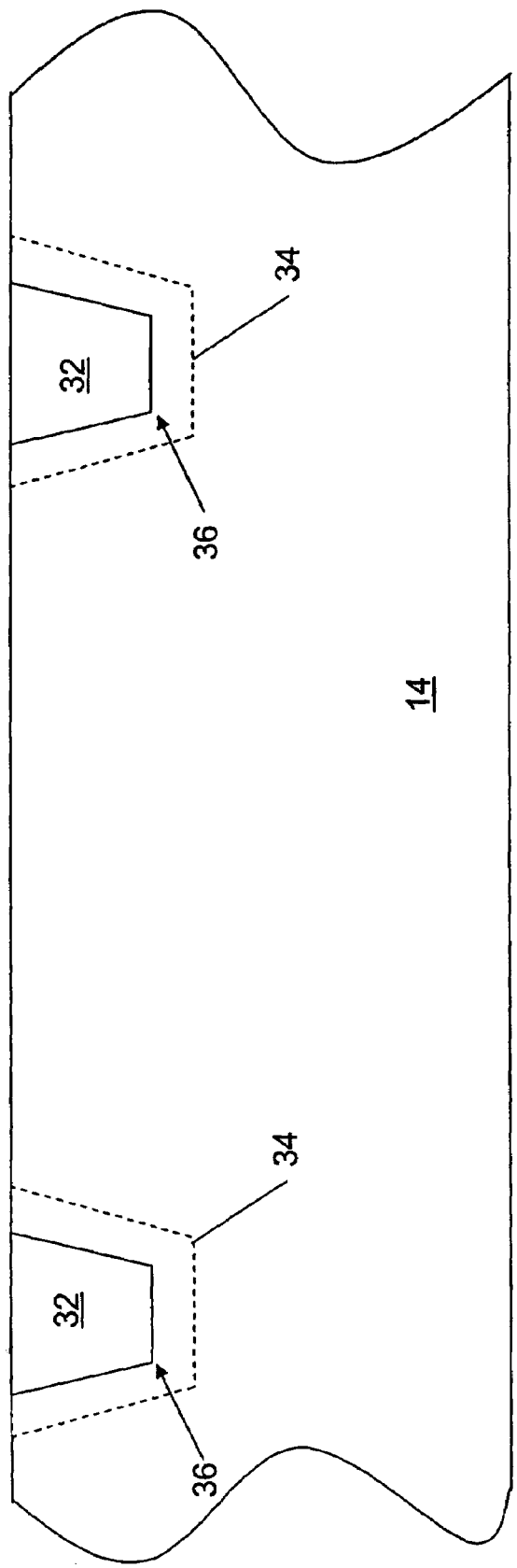

FIG. 4 illustrates the formation of an STI region 32 in the substrate 14. Specifically, the trenches 36 are filled with a dielectric, including, but not limited to, a chemical vapor deposited (CVD) silicon oxide or silicon dioxide or high density plasma (HDP) deposited silicon oxide or silicon dioxide. The dielectric-filled trench is then planarized by chemical mechanical planarization (CMP) or etch-back process such that the dielectric remains only in the trenches 36, and the STI region 32 has a top surface that is level with that of the substrate 14.

Figure 5:
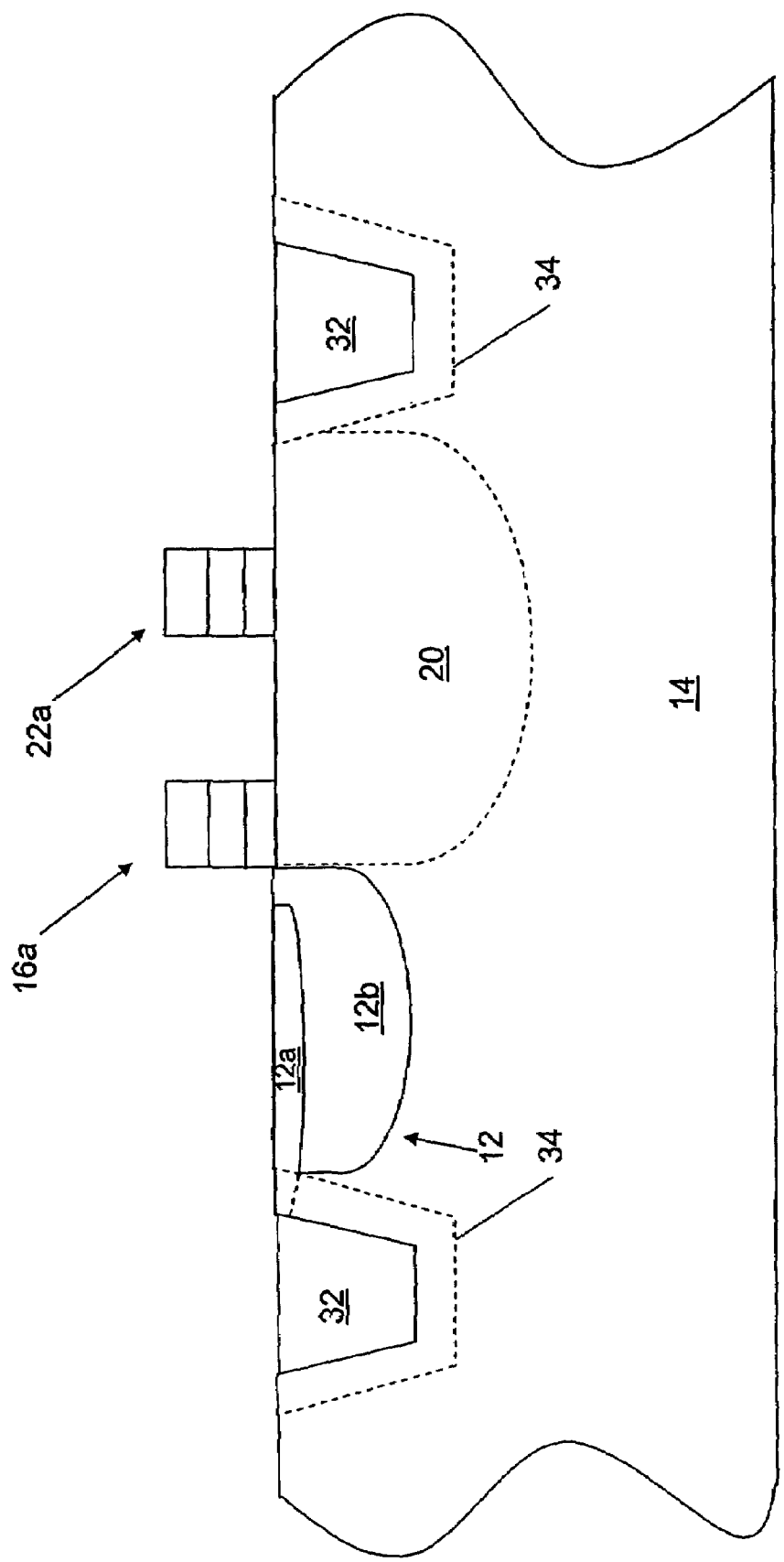

FIG. 5 illustrates the formation of a photosensor 12 having a p-region 12a and an n-region 12b formed in the substrate 14. It should be noted that although the photosensor is illustrated and described with reference to a p-n-p photodiode, it is not intended to limit the invention to such a photosensor. For example, the described photosensor 12 could be an n-p-n photodiode, a photogate, or any suitable photoconversion device capable of converting light to an electrical charge. FIG. 5 also illustrates the formation of a more heavily doped p-type well 20 in substrate 14. Additionally, a transfer transistor gate 16a and a reset transistor gate 22a are formed by conventional methods. It should be noted that transfer transistor gate 16a is formed only in a pixel cell 100 having a four-transistor (4T) configuration. Transfer transistor 16 (FIG. 6) is an optional transistor in pixel cell 100, and pixel cell 100 could have a three-transistor (3T) configuration, without a transfer transistor. Alternatively, pixel cell 100 could have more than four or less than three transistors.

Figure 6:
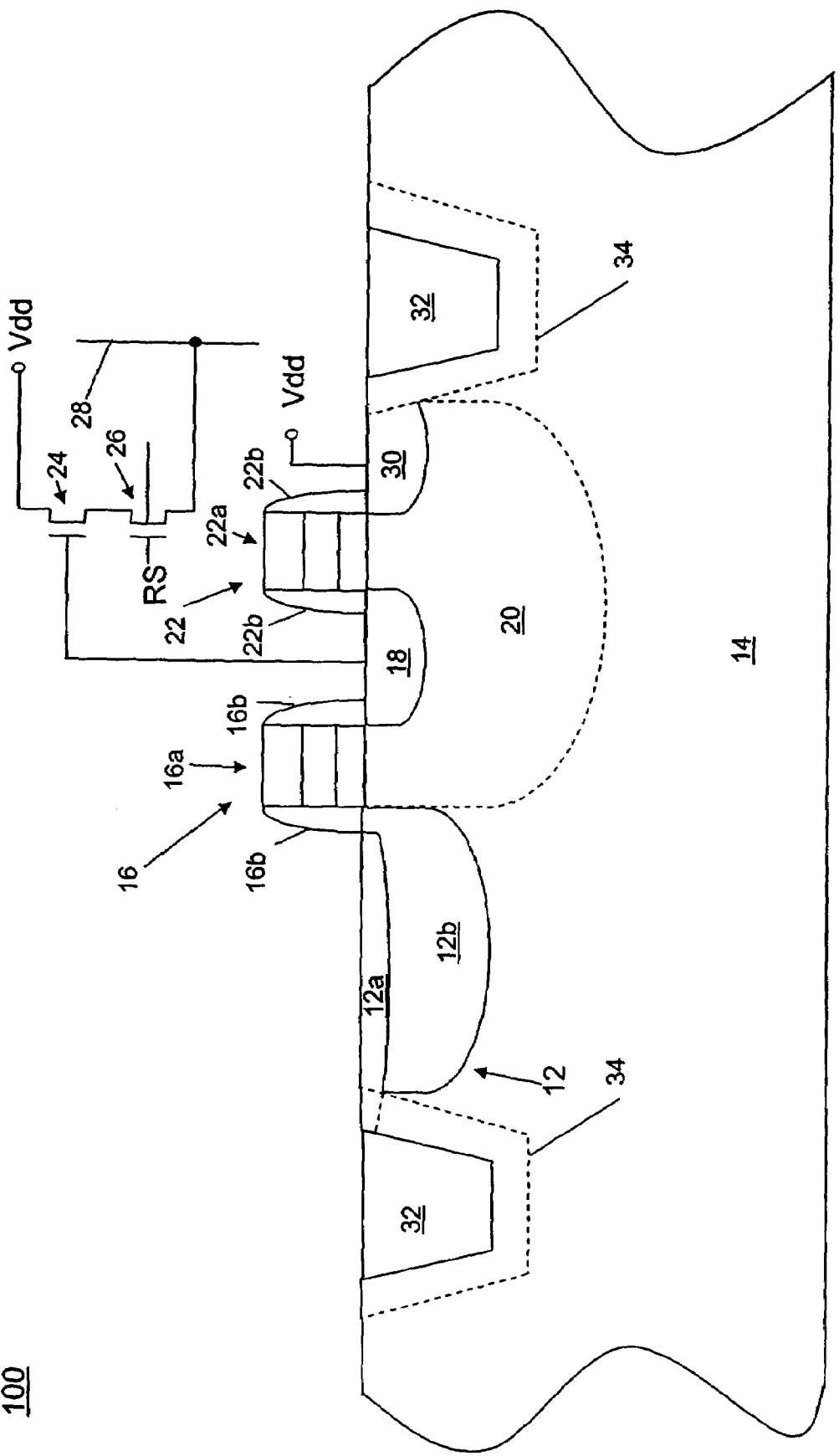

FIG. 6 illustrates the formation of gate stack sidewall insulators 16b, 22b on the sides of the gate stacks 16a, 22a, together forming transfer transistor gate 16 and reset transistor gate 22, respectively. FIG. 6 also illustrates the formation of n-type regions within p-type well 20; specifically, floating diffusion region 18 and source/drain region 30. Readout circuitry (shown schematically) is also formed, and includes source follower transistor 24, row select transistor 26, and column line 28.

FIGS. 3-6 illustrate only one exemplary method of forming the halogen-rich region 34 in the substrate 14, and is not intended to be limiting. Other methods of forming the halogen-rich region 34 within the substrate 14 may also be employed, resulting in the pixel cell 100 illustrated in FIG. 2. For example, halogen species may be incorporated through a high density plasma (HDP) deposition process. Another method of incorporating halogen species into the substrate 14 is by solid-source diffusion.

Figure 7:
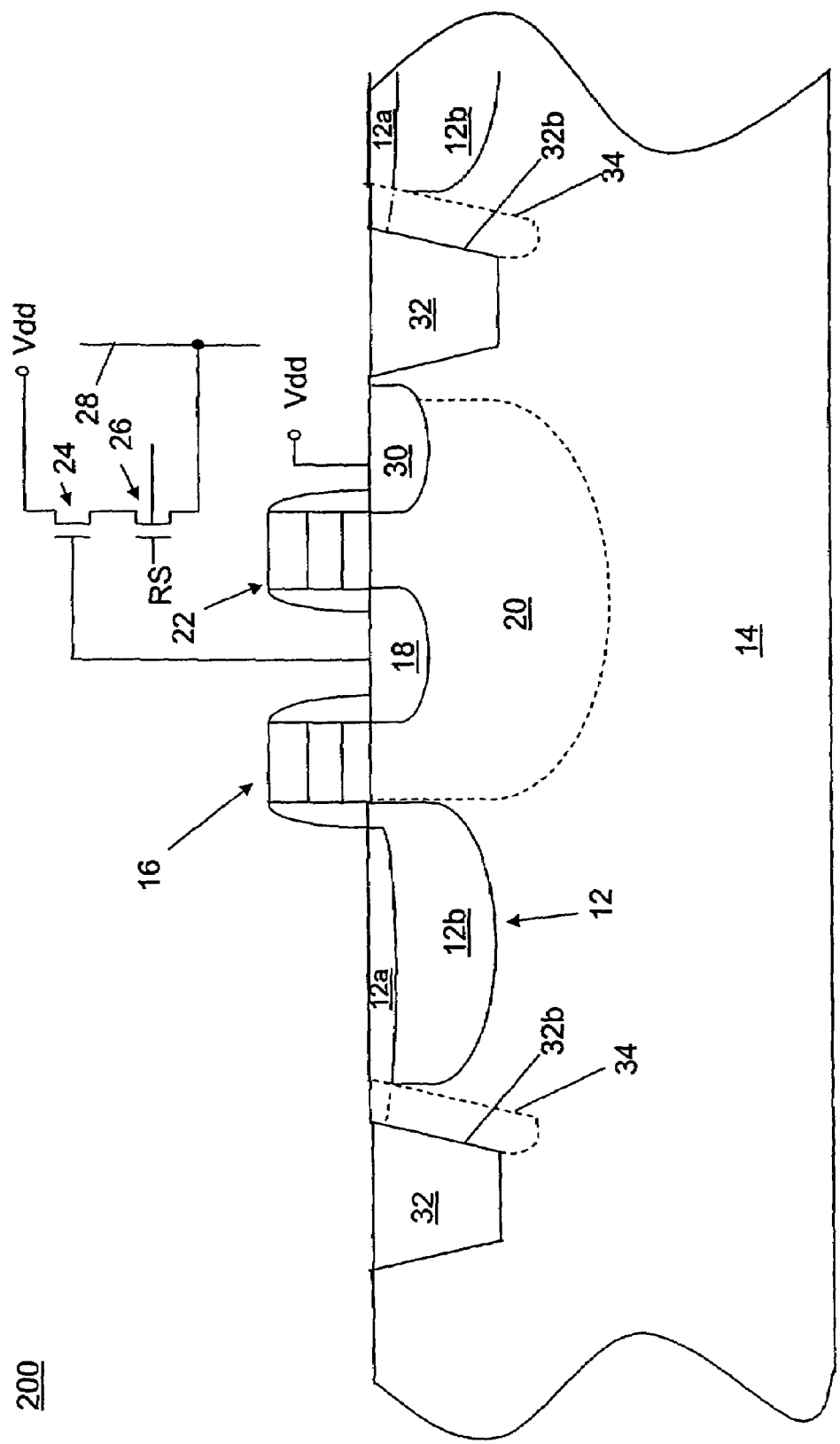
FIG. 7 illustrates a partial cross-sectional representation of a pixel cell constructed in accordance with a second exemplary embodiment of the invention.

The illustrated pixel cell 200 of FIG. 7 is a second embodiment of the invention, in which a halogen-rich region 34 is localized between STI region 32 and photosensor 12. Because most leakage occurs from STI sidewall 32b, specifically that portion of the STI sidewall 32b in contact with the p-region 12a of the photosensor 12, the halogen-rich region 34 can be localized between the photosensor 12 and STI sidewalls 32b, and still serve to suppress dark current.

Figure 8:
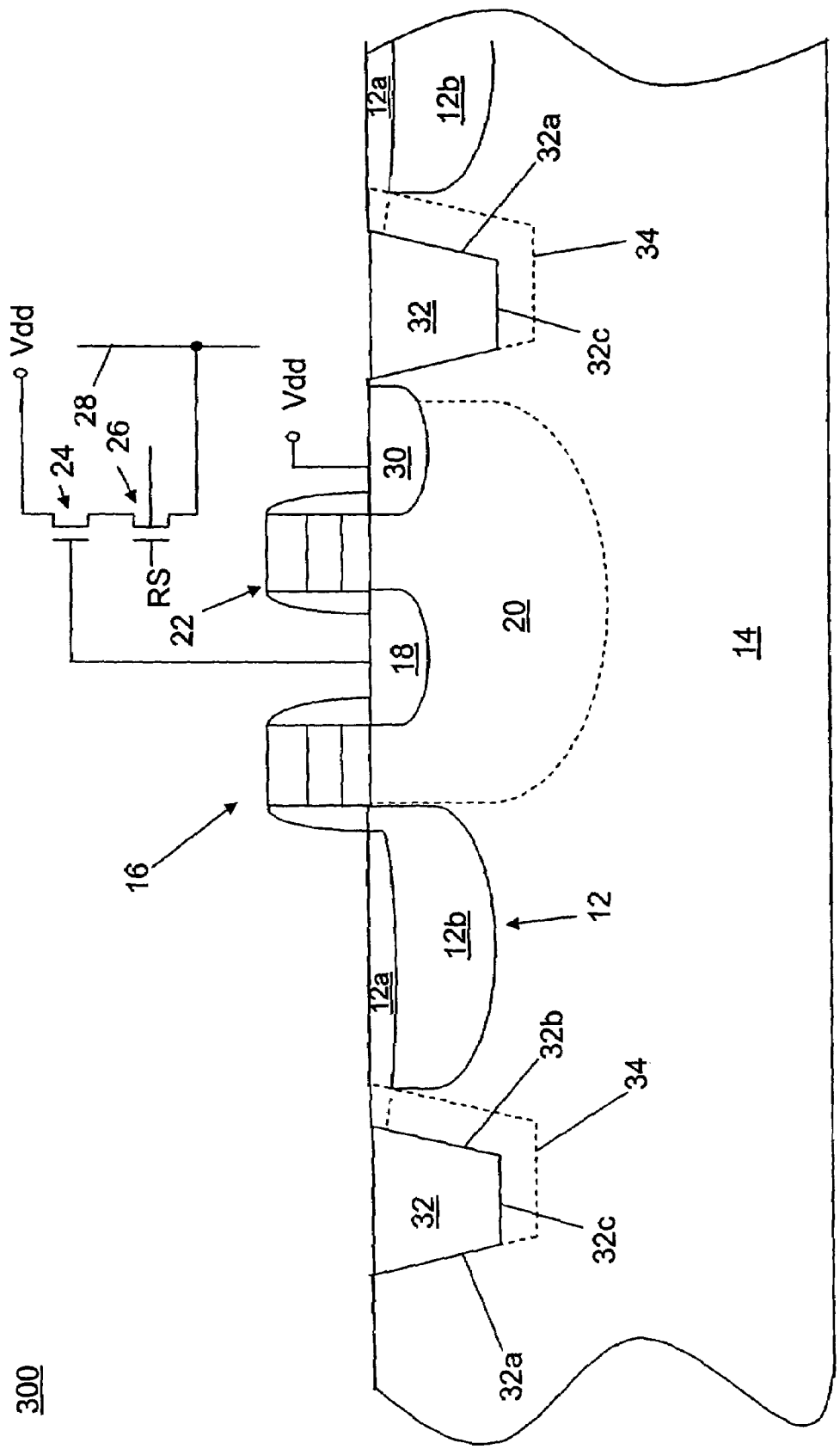
FIG. 8 illustrates a partial cross-sectional representation of a pixel cell constructed in accordance with a third exemplary embodiment of the invention.

Another region contributing to leakage is the STI bottom portion 32c, illustrated in FIG. 8. In the illustrated pixel cell 300 of FIG. 8, the halogen-rich region 34 is localized underneath the STI region 32 in addition to being localized between the photosensor 12 and the STI sidewall 32b. By forming the halogen doped region 34 underneath the STI region 32, the halogen-rich region 34 may counter any trap sites located in the STI bottom portion 32c, thereby suppressing any dark current in the pixel cell 300.

Figure 9:
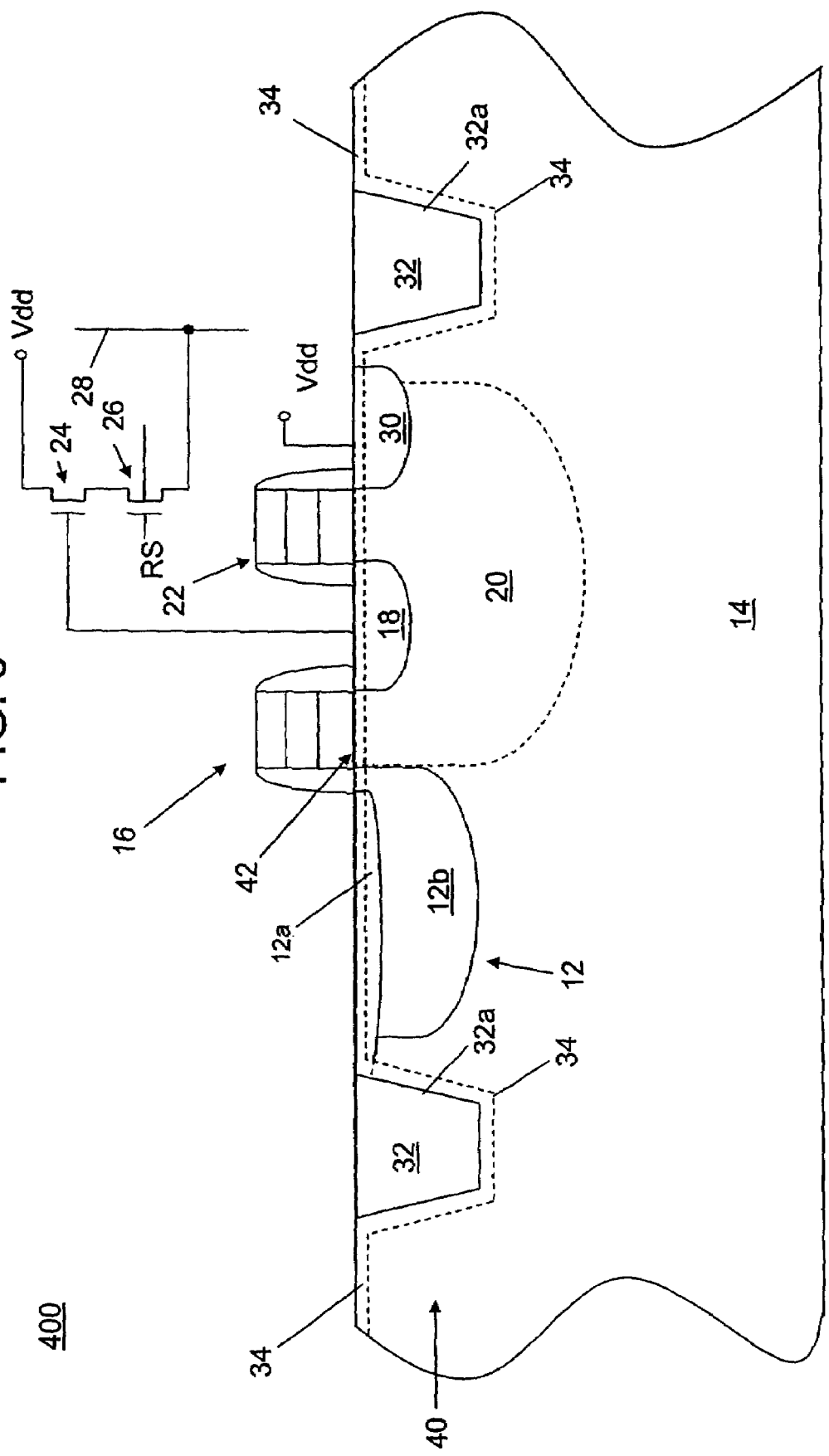
FIG. 9 illustrates a partial cross-sectional representation of a pixel cell constructed in accordance with a fourth exemplary embodiment of the invention.

Referring to FIG. 9, a halogen-rich region 34 is formed within a top region 40 of the substrate 14. Forming the halogen-rich region 34 within the entire top region 40 of the substrate 14, not only counters the effects of defects found in the silicon dioxide/silicon interface between the STI boundaries 32a and the substrate 14, as discussed above with respect to FIGS. 2-8, but also counters the negative effects of defects found in the silicon/gate oxide interface 42 between the transfer transistor gate 16a (FIG. 5) and the substrate 14, or the reset transistor gate 22a (FIG. 5) and the substrate 14. As discussed above with respect to FIG. 1, the silicon/gate oxide interface 42 contains defects that create trap sites along the gate oxide (e.g., transfer transistor gate 16a of FIG. 5) and the substrate 14. Halogen-rich region 34 counters the detrimental effects of the trap sites, resulting in a pixel cell 400 that prevents current generation or current leakage.

Figure 10:
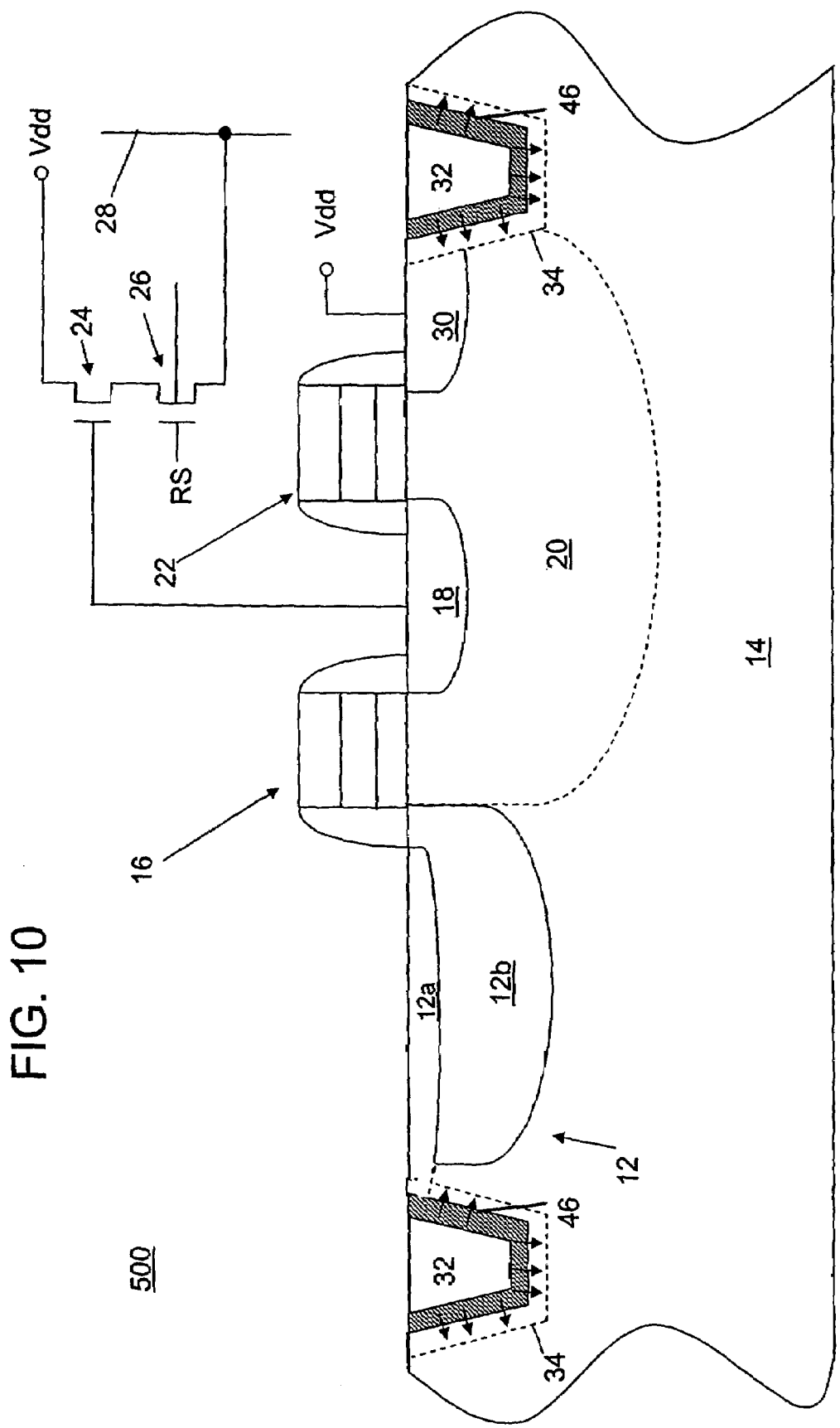
FIG. 10 illustrates a partial cross-sectional representation of a pixel cell constructed in accordance with a sixth exemplary embodiment of the invention.

FIG. 10 illustrates a pixel cell 500 in which a trench 36 (FIG. 4) is lined with a halogenated low constant dielectric material 46 prior to filling the trench 36 with a CVD or HDP deposited silicon oxide or silicon dioxide. For example, the trench 36 may be lined with fluorinated silicon oxide (SiOF), and then filled with a CVD silicon oxide material to form an STI region 32. By lining the trench 36 with a halogenated low constant dielectric material 46, e.g., SiOF, the halogen diffuses into the substrate 14, forming a halogen-rich region 34 between the STI region 32 and the substrate 14. Although illustrated as a thin material, it should be noted that the halogenated low constant dielectric material 46 could fill the entire trench, forming an STI region formed of, for example, SiOF.

Figure 11:
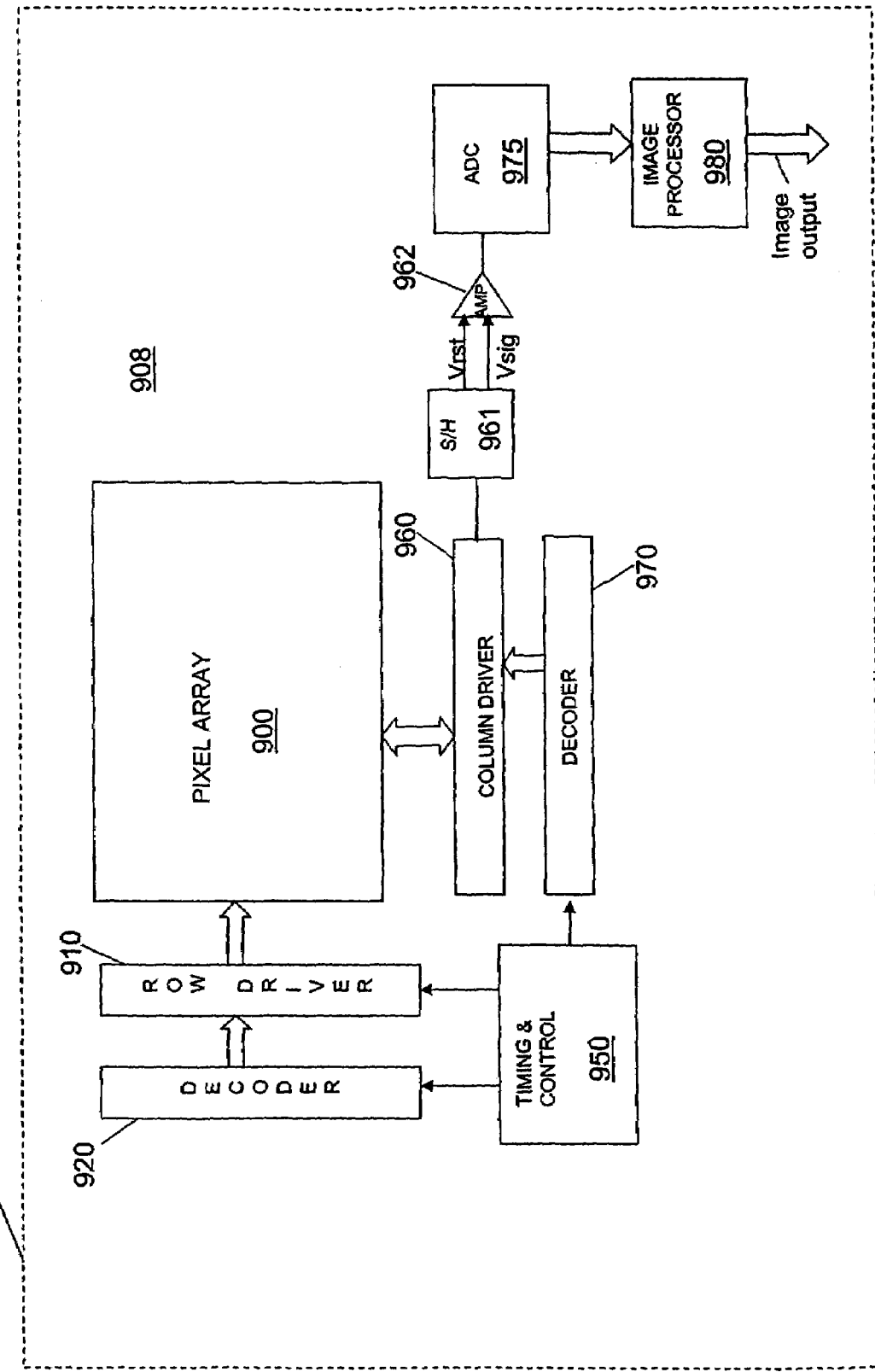
FIG. 11 is a block diagram of a CMOS imager incorporating at least one pixel cell constructed in accordance with an embodiment of the invention.

The pixel cells 100, 200, 300, 400, 500 of the invention may be combined with peripheral circuitry to form an imager device. For example, FIG. 11 illustrates a block diagram of a CMOS imager device 908 having a pixel array 900. Pixel array 900 comprises a plurality of pixels arranged in a predetermined number of columns and rows. The illustrated pixel array 900 contains at least one pixel cell 100, 200, 300, 400, 500 constructed in accordance with any one of the exemplary embodiments of the invention as described above with respect to FIGS. 2-10. For clarity's sake, the CMOS imager 908 of FIG. 11 is now discussed as incorporating at least one pixel cell 100 of FIG. 6; however this is not intended to limit the CMOS imager 908 to such an embodiment.

The pixel cells 100 of each row in array 900 are all turned on at the same time by a row select line, and the pixel cells 100 of each column are selectively output by respective column select lines. A plurality of rows and column lines are provided for the entire array 900. The row lines are selectively activated in sequence by the row driver 910 in response to row address decoder 920 and the column select lines are selectively activated in sequence for each row activation by the column driver 960 in response to column address decoder 970. The CMOS imager 908 is operated by the control circuit 950, which controls address decoders 920, 970 for selecting the appropriate row and column lines for pixel readout, and row and column driver circuitry 910, 960 to apply driving voltage to the drive transistors of the selected row and column lines.

The pixel output signals typically include a pixel reset signal $V_{rst}$ taken from the floating diffusion node (e.g., 18 of FIG. 6) when it is reset and a pixel image signal $V_{sig}$, which is taken from the floating diffusion node (e.g., 18 of FIG. 6) after charges generated by an image are transferred to the node. The $V_{rst}$ and $V_{sig}$ signals are read by a sample and hold circuit 961 and are subtracted by a differential amplifier 962, which produces a difference signal ($V_{rst}$–$V_{sig}$) for each pixel cell 100, which represents the amount of light impinging on the pixels. This signal difference is digitized by an analog-to-digital converter 975. The digitized pixel difference signals are then fed to an image processor 980 to form a digital image. In addition, as depicted in FIG. 11, the CMOS imager device 908 may be included on a single semiconductor chip (e.g., wafer 1100).

Figure 12:
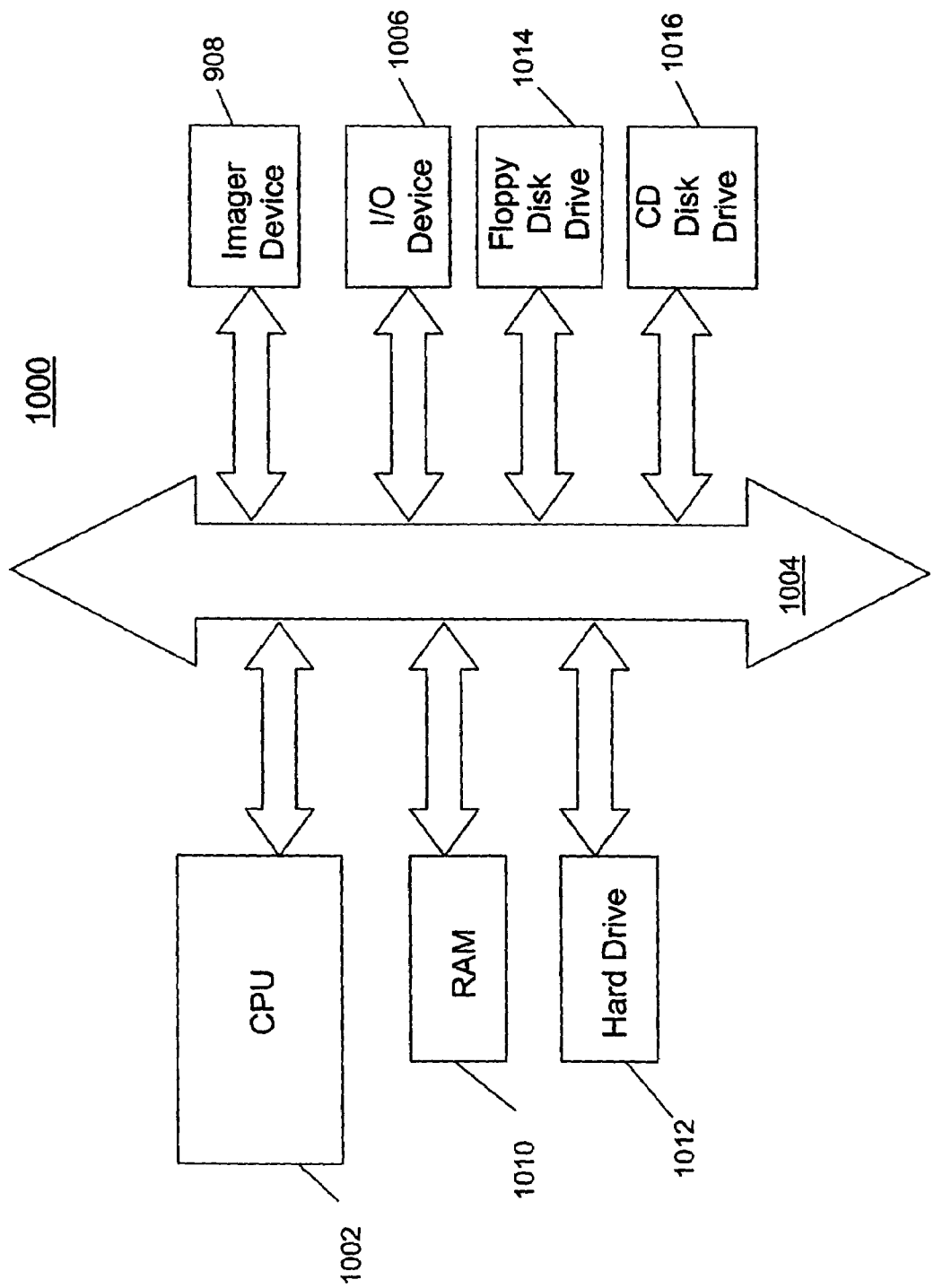
FIG. 12 is a schematic diagram of a processor system incorporating the CMOS imager of FIG. 11 in accordance with an exemplary embodiment of the invention.

FIG. 12 shows system 1000, a typical processor based system modified to include the imager device 908 illustrated in FIG. 11. Processor based systems exemplify systems of digital circuits that could include an imager device 908. Examples of processor based systems include, without limitation, computer systems, camera systems, scanners, machine vision systems, vehicle navigation systems, video telephones, surveillance systems, auto focus systems, star tracker systems, motion detection systems, image stabilization systems, and data compression systems for high-definition television, any of which could utilize the invention.

System 1000 includes an imager device 908 having the overall configuration depicted in FIG. 11 with pixels of array 900 constructed in accordance with any of the various embodiments of the invention. System 1000 includes a processor 1002 having a central processing unit (CPU) that communicates with various devices over a bus 1004. Some of the devices connected to the bus 1004 provide communication into and out of the system 1000; an input/output (I/O) device 1006 and imager device 908 are examples of such communication devices. Other devices connected to the bus 1004 provide memory, illustratively including a random access memory (RAM) 1010, hard drive 1012, and one or more peripheral memory devices such as a floppy disk drive 1014 and compact disk (CD) drive 1016. The imager device 908 may receive control or other data from CPU 1002 or other components of system 1000. The imager device 908 may, in turn, provide signals defining images to processor 1002 for image processing, or other image handling operations.

It should be noted that although the invention has been described with specific references to CMOS pixel cells having a halogen-rich region 34 (FIGS. 2-10) formed between a photosensor 12 and STI region 32, the invention has broader applicability and may be used in any imaging apparatus. For example, the present invention may be used in conjunction with charge-coupled-device (CCD) imagers. The above description and drawings illustrate preferred embodiments which achieve the objects, features, and advantages of the present invention. Although certain advantages and preferred embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Letters Patent of the United States is:

1. A method of forming a pixel cell, said method comprising the acts of:
   forming a photosensor having a first doped region and a second doped region in association with a semiconductor substrate, said photosensor capable of generating dark current;
   forming a trench in said semiconductor substrate adjacent to said photosensor;
   forming a halogen-rich region localized at least at a sidewall region of said trench, said halogen-rich region having a halogen concentration sufficient to reduce said dark current; and
   filling said trench with a dielectric material.

2. The method of claim 1, wherein said act of forming a halogen-rich region comprises doping said substrate with an ion selected from the group consisting of fluorine, chlorine, bromine, iodine, and any combination of fluorine, chlorine, bromine and iodine.

3. The method of claim 2, wherein said act of doping said substrate is performed by ion implantation.

4. The method of claim 2, wherein said act of doping said substrate is performed by incorporating halogen through a high density plasma deposition process.

5. The method of claim 2, wherein said act of doping said substrate is performed by solid source diffusion of halogen ions.

6. The method of claim 1, wherein said halogen-rich region is formed at a depth of about 300 Å to about 800 Å from a surface of said semiconductor substrate.

7. The method of claim 1, wherein said halogen-rich region is formed having a concentration of halogen from about $5 \times 10^{13}/cm^3$ to about $5 \times 10^{15}/cm^3$.

8. The method of claim 1, wherein said first doped region of said photosensor is formed to overlap with said halogen-rich region.

9. The method of claim 1, further comprising the act of providing a mask over said semiconductor substrate before said step of forming said halogen-rich region.

10. The method of claim 1, further comprising the act of forming a charge collection region in said semiconductor substrate.

11. The method of claim 10, further comprising the act of forming a transfer transistor between said photosensor and said charge collection region.

12. The method of claim 1, wherein said act of forming a halogen-rich region comprises doping said substrate with an ion selected from the group consisting of chlorine, bromine, iodine, and any combination of chlorine, bromine, and iodine.

* * * * *